(12) United States Patent  
Smiley

(10) Patent No.: US 8,379,699 B2
(45) Date of Patent: Feb. 19, 2013

(54) SPREAD SPECTRUM PILOT SIGNALS IN AN ELECTRONIC DUPLEXER

(75) Inventor: Russell Smiley, Richmond (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 141 days.

(21) Appl. No.: 13/046,107

(22) Filed: Mar. 11, 2011

(65) Prior Publication Data

US 2012/0230368 A1 Sep. 13, 2012

(51) Int. Cl.
*H04B 1/38* (2006.01)

(52) U.S. Cl. ........ 375/219; 375/316; 375/295; 375/297; 455/114.1; 455/63.1; 330/151; 330/149

(58) Field of Classification Search ............... 375/219, 375/316, 295, 297; 330/151, 149; 455/114.1, 455/63.1
See application file for complete search history.

(56) References Cited

U.S. PATENT DOCUMENTS

| | | |
|---|---|---|
| 5,386,198 A | 1/1995 | Ripstrand et al. |
| 6,081,549 A | 6/2000 | Shou et al. |
| 7,595,689 B1 | 9/2009 | Kenington |
| 7,702,295 B1 | 4/2010 | Nicholls et al. |

FOREIGN PATENT DOCUMENTS

GB 2273622 A 6/1994

OTHER PUBLICATIONS

O'Sullivan, Tomás, "Adadptive Duplexer Implemented Using Single-Path and Multipath Feedforward Techniques with BST Phase Shifters", IEEE Transactions on Microwave Theory and Techniques, vol. 53, No. 1, Jan. 2005.
Roussel, A., et al., "Frequency Agile Bandstop Filter (FABSF)", Microwave Symposium Digest; IEEE MTT-S International, Jun. 15, 2008, pp. 1099-1102, XP031441518.
Choi, H., et al., "Digital Controlled Co-channel Feedback Interference Cancellation System with Broadband Cancellation", Proceedings of the 1st European Wireless Technology Conference; IEEE, Oct. 27, 2008, pp. 194-197, Amsterdam, NL, XP031408507.

*Primary Examiner* — Zewdu Kassa
(74) *Attorney, Agent, or Firm* — Coats & Bennett, P.L.L.C.

(57) ABSTRACT

Interference-reducing circuits include a feed-forward circuit for subtracting all or part of a desired transmitter-signal component from a signal coupled from the power amplifier's output path. The error signal from this feed-forward circuit contains a replica of distortion in the power amplifier output. A cancellation loop adjusts the phase and/or amplitude of this error signal and combines this adjusted error signal with an interference-carrying signal, removing some of the undesired distortion. A spread-spectrum pilot signal is used in one or both loops, to provide a reference signal that can be monitored by an adjustment circuit, which measures the magnitude and/or phase of a spread-spectrum signal that is injected into the interference-carrying signal and, based on that measurement, adjusts the amplitude, phase, and/or delay of the cancellation signal that is added to the interference-carrying signal. This yields a reduced-interference signal in which undesired distortion is reduced.

22 Claims, 13 Drawing Sheets

SPREAD SPECTRUM PILOT SIGNALS IN AN ELECTRONIC DUPLEXER

TECHNICAL FIELD

The present invention relates generally to radio communication devices and relates in particular to methods and apparatus for reducing undesired emissions from a power amplifier in a radio transceiver.

BACKGROUND

In radio communications systems, a transmitter transmits signals that are picked up and processed by a receiver at some distance from the transmitter. A few systems include only one transmitter and one or more corresponding receivers, and thus support only one-way communications. A broadcast television system can be viewed in this way, where a transmitter corresponding to a single television station sends one-way signals to multiple television receivers. Similarly, a few communication systems include only a single receiver that monitors the signals transmitted from several transmitters. Again, these systems support communications in only a single direction. However, there are many communication systems that require bi-directional communication—these systems require both a transmitter and receiver at each system endpoint, as shown in transceivers 110 and 150, in FIG. 1. Often, the transmitter and receiver for a given endpoint, such as transmitters 115 and 165 and receivers 125 and 155 in FIG. 1, are housed in the same device, and may share one or more antennas.

If both transmitters in a communications link are transmitting simultaneously, there exists the potential that either receiver is unable to receive signals, due to interference from its corresponding transmitter or from other transmitters. A transmitter is designed to transmit a large enough power signal to overcome the loss inherent in transmitting over a distance so that the signal can still be received. Conversely, a receiver is designed to be sensitive to extremely small signals to ensure that a transmitter can minimize the amount of power transmitted over a specified distance. Because of the receiver's sensitivity, it is possible for an unexpectedly large signal to interfere with the receiver operation, or even to physically damage sensitive radio components. Since the transmitter in a radio system is by necessity a high-power signal, it may easily interfere with a co-located receiver in the absence of careful system design.

Of course, strong signals that are not part of the normal operation of the communication system can also interfere with the receiver. Possible interferers include television transmitters, radar systems, electrical noise from industrial facilities, or other communication systems. There may be more than one interferer present. Thus, in addition to coordinating transmissions and reception within a given system, a well-designed system must also be designed to accommodate interference arising outside the system. Further, the system should be designed to minimize potential interference to other radio systems.

In radio transceivers, a power amplifier is used to amplify the transmit signal to an appropriate level for transmission across the air (or through a cable or waveguide). The power amplifier, like any other active device in a signal processing chain, adds noise and distortion to the signal. However, because the power amplifier signals are generally quite large, the noise and distortion introduced by the power amplifier can be particularly pronounced, especially when the power amplifier is designed to minimize power consumption. Power amplifier linearization techniques may be used to reduce the distortion introduced by the power amplifier, but this generally does not impact the lower-level broadband noise emitted by the amplifier. Furthermore, specifications for a given radio system and/or government regulations may impose stricter requirements on emissions from the power amplifier, particularly with respect to undesired out-of-band emissions, than are readily achievable through linearization techniques.

The noise and distortion emissions from the power amplifier can be viewed as an "error signal" added by the power amplifier to the desired transmit signal. Generally it is necessary to remove a large portion of this error signal before the signal is transmitted into free space via an antenna. In a conventional radio system, a transmit filter, which may be part of a radio duplexer circuit, serves the function of rejecting these error signals.

One technique that is sometimes used to "linearize" a power amplifier's response is called "pre-distortion." With this technique, a power amplifier input signal is enhanced with another signal that effectively anticipates the distortion produced by the PA. This pre-shaping of the power amplifier's input signal to anticipate the distortion by the power amplifier can significantly reduce the effective distortion of the desired transmit signal. Both analog and digital pre-distortion techniques are possible.

One method for coordinating the transmission and reception of signals to reduce the impact of undesired emissions is to have the transmitters and receivers for a given system all operate on the same frequency, and then coordinate which radio system is receiving while the other is transmitting, and vice versa. This approach is called time-division duplex (TDD) communication. A portion of a radio transceiver 200 suitable for use in a TDD system is shown in FIG. 2. The transmitter side of radio transceiver 200 includes a power amplifier 210 and a circulator 220, while the receiver side includes a low-noise amplifier 230. Both sides are coupled to an antenna path through switch 240; the antenna path comprises filter 250, antenna cable 260, and antenna 270.

As seen in the radio transceiver 200, in a TDD system both the receiver and transmitter at a given endpoint can use the same filter pass-band to reject interfering signals picked up by the antenna 270 from outside sources, in other frequency ranges. However, other methods must be found to ensure that radio systems within the communication system do not interfere with one another. In a TDD system, the timing of radio transmission and reception is carefully managed so that a transmitter is transmitting when a receiver at the other radio system is receiving and vice versa.

Another approach to coordination is called frequency-division duplex (FDD) communication, in which transmissions are separated by frequency. Thus, the transmitter of one radio system is on one frequency (e.g., f1), and the corresponding receiver (or receivers) at the other end of the communication link is tuned to the same frequency. At the same time, the transmitter and corresponding receiver (or receivers) of the other radio system is tuned to another frequency (e.g., f2). Because the transmitter and receiver pairs are on different frequencies, filters can now be used to ensure the transceivers do not interfere with each other, as well as to reject other interfering signals. This is shown in FIG. 3, which illustrates a radio transceiver 300 capable of full, frequency-division duplexed communication. Outgoing transmissions from power amplifier 210 are separated in frequency from incoming transmissions for low-noise amplifier 230, and are separately filtered by transmit filter 315, which reduces noise in the receiver band, and receiver filter 320, which rejects emissions in the transmitter band. Together, these filters form duplexer 320 (sometimes called a diplexer).

FIG. 4 illustrates an alternative configuration for a frequency-division duplexed radio transceiver 400, in which the receiver and transmitter each has its own antenna 270. Very limited isolation between the transmitter and receiver is provided by the physical separation of the antennas 270. The transmit filter 410 and receive filter 420 provide additional isolation, as each can be tuned to reject the frequency passed by the other. FIG. 5 illustrates yet another configuration for a frequency-division duplexing transceiver 500, in which circulator 220 serves as the duplexing element. Circulator 220 provides some isolation between the transmitter and receiver components; additional isolation is provided by the transmit filter 510, which is configured to reject noise in the receiver band, and receiver filter 520, which is configured to reject transmitter band emissions.

In an FDD system, electronic cancellation circuits may replace some or all of the transmit and receive filter functionality. An example of an electronic duplex filter is described in U.S. Pat. No. 7,702,295, issued 20 Apr. 2010 to Nicholls et al., the entire contents of which are incorporated by reference herein to provide background for the disclosure that follows. In a TDD system, electronic cancellation circuits may assist with isolating the transmit signals from the sensitive receiver circuitry.

SUMMARY

Described in detail below are techniques for adapting spread-spectrum pilot signals to an electronic duplexer cancellation system. Several of these techniques exploit the fact that the lower power-density of a spread-spectrum pilot signal reduces the potential for the pilot itself to interfere with received signals. This also allows the pilot to be positioned in a bandwidth that overlaps a receiver band of the communications transceiver, facilitating a more accurate characterization and more complete cancellation of receiver band noise than can be achieved using a continuous-wave pilot that is offset from the receiver band.

Interference-reducing circuits according to several embodiments of the present invention include two cancellation loops. A first loop is a feed-forward circuit for subtracting all or part of a desired transmitter-signal component from a signal coupled from the power amplifier's output path. This feed-forward circuit produces an error signal that contains a replica of the noise and distortion in the power amplifier output. A second cancellation loop adjusts the phase and/or amplitude of this error signal and combines this adjusted error signal with an interference-carrying signal, to remove all or part of the undesired noise and distortion from the interference-carrying signal.

In several embodiments, a spread-spectrum pilot signal is used in one or both of the loops, to provide a reference signal that can be monitored by an adjustment circuit. An adjustment circuit is configured to measure the magnitude and/or phase of a spread-spectrum signal that is injected into the interference-carrying signal and, based on that measurement, to adjust the amplitude, phase, and/or delay of the cancellation signal that is added to the interference-carrying signal. When properly adjusted, the combination of the cancellation signal with the interference-carrying signal yields a reduced-interference signal, in which undesired distortion and/or noise is substantially reduced. The use of a spread-spectrum pilot greatly simplifies the measurement process as well as reducing the potential for introducing undesired noise into the system.

In some embodiments, a spread-spectrum pilot is applied to the transmit signal and also to a reference signal that represents the desired output from the power amplifier. This approach is particularly useful where pre-distortion techniques are used. The reference signal is a replica of the desired output from the power amplifier. Separately applying a spread-spectrum pilot to the reference signal and to the power amplifier path allows the relative amplitude and phase of the power amplifier's output to be tracked, so that a phase-adjusted and/or amplitude-scaled version of the reference signal can be subtracted from that output, to create an error signal that has the desired transmit signal cancelled out and only contains the error signal information, i.e., residual distortion and noise.

Another spread-spectrum pilot signal can be applied to the output signal of the power amplifier and to the error signal so that phase/amplitude control of the error signal can be applied, via the second loop, to cancel the error signal from an interference-carrying signal in the power amplifier's output path or in a path coupled to the power amplifier output (e.g., in a receive path separated from the power amplifier by a duplexer). Thus, as described in further detail below, a pilot signal can be introduced to the main path and to the error signal path of each of one or more cancellation loops, to facilitate phase/amplitude control of the error signal for optimal correction/cancellation.

Details of various circuits and methods for reducing undesired emissions from a power amplifier according to the above-summarized techniques are also disclosed. Of course, those skilled in the art will appreciate that the present invention is not limited to the above features, advantages, contexts or examples, and will recognize additional features and advantages upon reading the following detailed description and upon viewing the accompanying drawings.

DETAILED DESCRIPTION

Figure 1:
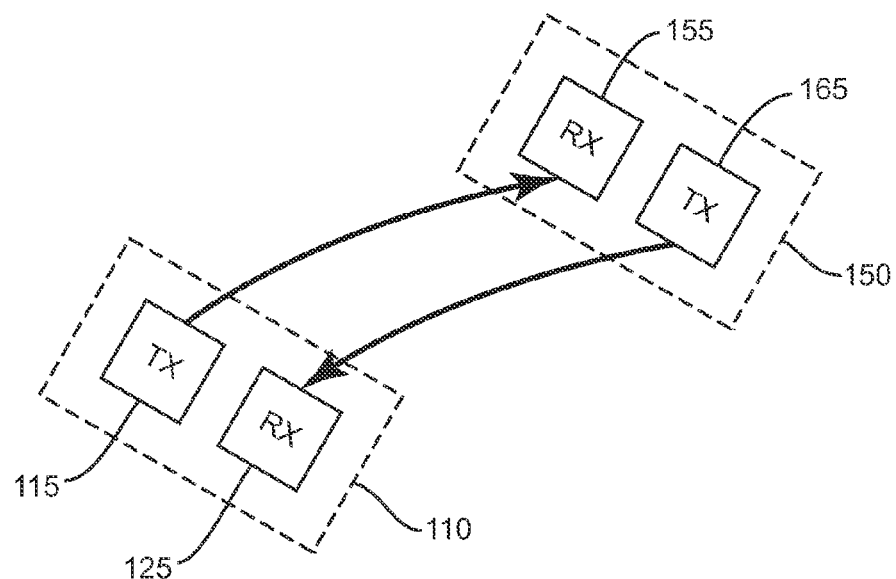
FIG. 1 illustrates a bi-directional radio communication system.
Figure 2:
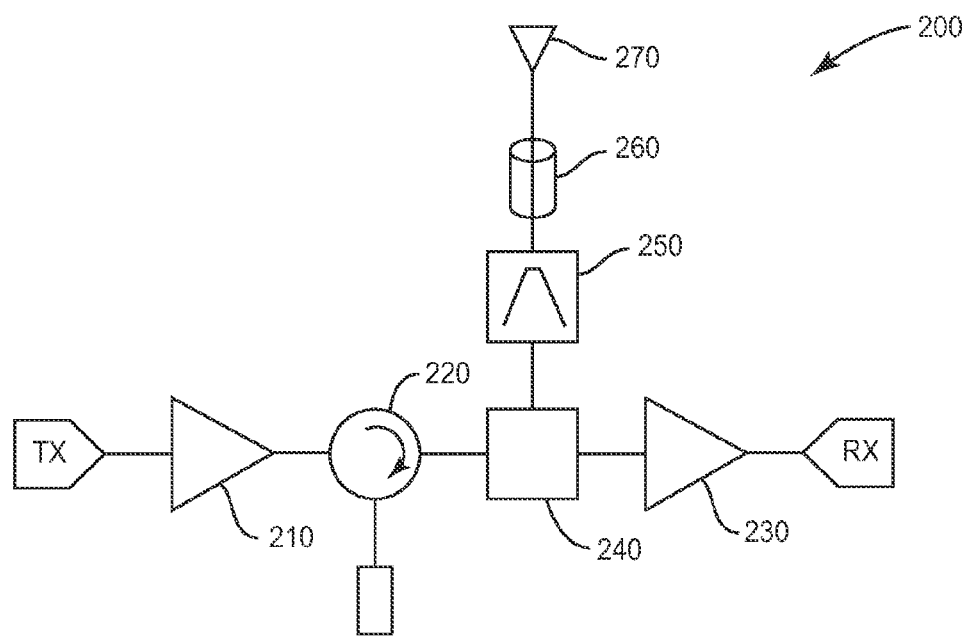
FIG. 2 is a block diagram of a time-division-duplexing radio transceiver.
Figure 3:
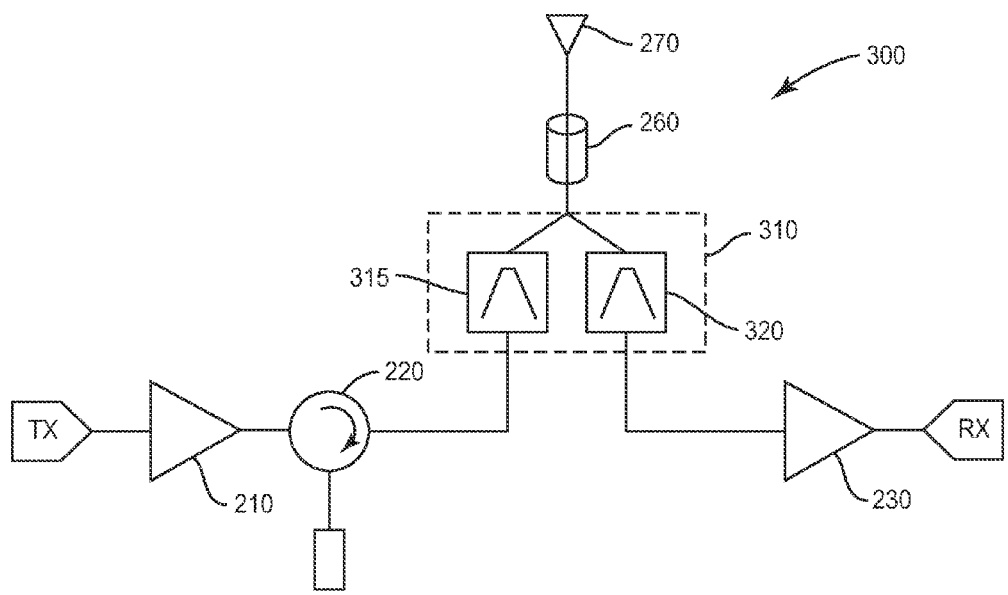
FIG. 3 is a block diagram of a frequency-division-duplexing (FDD) radio transceiver.
Figure 4:
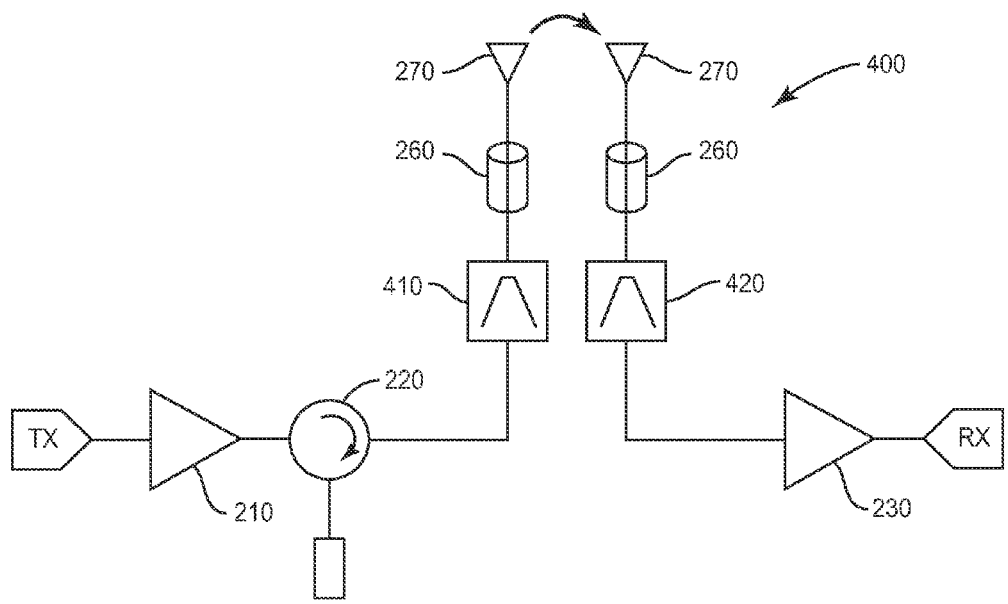
FIG. 4 is a block diagram of another FDD radio transceiver.
Figure 5:
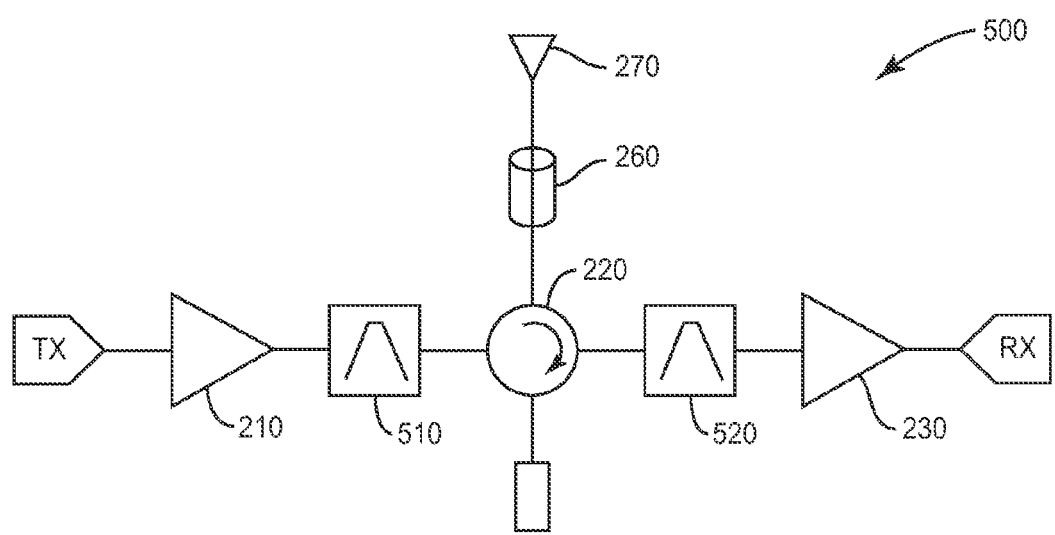
FIG. 5 is a block diagram of still another FDD radio transceiver.

In the discussion that follows, several embodiments of the present invention are described herein with respect to radio transceivers adapted for over-the-air transmission, such as may be employed in cellular telephones or cellular base stations. However, the invention is not so limited, and the inventive concepts disclosed and claimed herein may be advantageously applied in other contexts as well, including, for example, communications transceivers coupled to waveguides, coaxial cable, and the like, operating at radio frequencies, microwave frequencies, or even at higher frequencies. Those skilled in the art will appreciate that the detailed design of a radio transceiver may vary according to its intended use, relevant standards, and/or according to cost-performance tradeoffs specific to a given manufacturer, but that the basics of these detailed designs are well known. Accordingly, those details that are unnecessary to a full understanding of the present invention are omitted from the present discussion.

Furthermore, those skilled in the art will appreciate that the use of the term "exemplary" is used herein to mean "illustrative," or "serving as an example," and is not intended to imply that a particular embodiment is preferred over another or that a particular feature is essential to the present invention. Likewise, the terms "first" and "second," and similar terms, are used simply to distinguish one particular instance of an item or feature from another, and do not indicate a particular order or arrangement, unless the context clearly indicates otherwise. Further, the term "step," as used herein, is meant to be synonymous with "operation" or "action." The description herein of a sequence of steps does not imply that these operations must be carried out in a particular order, or even that these operations are carried out in any order at all, unless the context or the details of the described operation clearly indicates otherwise.

As discussed above, electronic cancellation circuits may be used to replace or augment radio-frequency (RF) filter functionality in communications transceivers. In some of these electronic cancellation circuits, pilot signals are used to assist with automated tuning of the cancellation circuits. This is shown in the Nicholls patent referenced earlier, which describes the use of continuous-wave (CW) pilot signals to "tune" the electronic filter functionality to the correct frequency. These pilot signals provide a clean reference that the electronic cancellation circuits can more easily detect and cancel.

One problem with CW pilot signals is that they cannot be deployed directly in the bandwidth of a desired signal, because they would then cause interference to the desired signals that would be difficult to remove without distorting the desired signals. However, deployment off-frequency means that phase and amplitude information derived from the CW pilot is only an approximation to the on-frequency behavior of the circuit. Of course, it is this on-frequency behavior which generally yields the most desirable information. Another problem with CW pilot signals is that they require very complete cancellation, to avoid the possibility that they interfere with normal operations of the circuit, such as automatic-gain control operations.

It is also possible, although more difficult, to directly detect and cancel the undesired emissions in the modulated transmit and receive signals, i.e., without using a pilot signal. However, direct detection from the modulated signal can be noisy, and it can be quite difficult to acquire a good quality reference signal. Using lots of averaging to reduce the noise can take a long time, which would slow down the response of a system.

Outside the context of electronic filters, spread-spectrum pilot signals have been applied to feed-forward linearization of power amplifiers. This has been demonstrated, for example, in U.S. Pat. No. 5,386,198, issued 31 Jan. 1995 to Ripstrand et al., the entire contents of which are incorporated herein by reference to provide background for the disclosure that follows.

The techniques described herein adapt spread-spectrum pilot signals to an electronic duplexer cancellation system. In particular, several of these techniques exploit the fact that a spread-spectrum pilot's energy can be distributed over a relatively large frequency band (e.g., several times larger than the information bandwidth of the transmitted signals), reducing the potential for the pilot itself to interfere with received signals. The low power-density of the spread-spectrum pilot signal allows it to be positioned in a bandwidth that overlaps a receiver band of the communications transceiver, allowing a more accurate characterization and more complete cancellation of receiver band noise than can be achieved with a CW pilot that is offset from the receiver band.

More particularly, an interference-reducing circuit according to several embodiments of the present invention includes two cancellation loops. A first loop is a feed-forward circuit for subtracting all or part of a desired transmitter-signal component from a signal coupled from the power amplifier's output path. This feed-forward circuit produces an error signal that contains a replica of the noise and distortion in the power amplifier output. A second cancellation loop adjusts the phase and/or amplitude of this error signal and combines this adjusted error signal with an interference-carrying signal, to remove all or part of the undesired noise and distortion from the interference-carrying signal.

The interference-carrying signal can be at any of several places in the radio transceiver. For instance, the interference-reducing circuit may be configured to eliminate undesired power amplifier emissions as close to the source as possible— in this case, the cancellation of the emissions with the adjusted error signal can take place in the power amplifier's output path, i.e., before any duplexing element.

In other embodiments, the circuit may be instead configured primarily to eliminate undesired emissions that have "leaked" into the receiver input path—in this case, the cancellation of the undesired transmitter emissions may be positioned in the receiver path, e.g., between an antenna duplexer element and a low-noise amplifier in the receive path. It is also possible to position the cancellation on the antenna side of the duplexer, although this approach may be undesirable due to the extra losses in the antenna path introduced by the coupling of the cancellation signal to the antenna path—with this approach, any losses introduced by the coupling affect both the transmit path and the receive path. In still another approach, cancellation may be introduced into both the power amplifier path and the receiver input path—this approach requires an additional cancellation loop, as described in further detail below.

In several embodiments of these circuits, a spread-spectrum pilot signal is used in one or both of the loops, to provide a reference signal that can be monitored by an adjustment circuit. For instance, an adjustment circuit can be configured to measure the magnitude and/or phase of a spread-spectrum signal that is injected into the interference-carrying signal and, based on that measurement, to adjust the amplitude, phase, and/or delay of the cancellation signal that is added to the interference-carrying signal. When one or more of these parameters of the cancellation signal is properly adjusted, the combination of the cancellation signal with the interference-carrying signal yields a reduced-interference signal, in which undesired distortion and/or noise is substantially reduced. The use of a spread-spectrum pilot greatly simplifies the characterization of the amplitude, phase, and/or delay of the cancellation, and also reduces the potential for introducing undesired noise into the system.

In some embodiments, then, a spread-spectrum pilot is applied to both the transmit signal and also to a reference signal that represents the desired output from the power amplifier. This approach is particularly useful where pre-distortion techniques are used. In this case, the shape of the signal input to the power amplifier is appreciably different (intentionally) from the shape of the power amplifier's output. To best remove residual distortion and noise that is not accounted for by the pre-distortion, it is necessary to first remove the desired signal components from the power amplifier output. Thus, the reference signal is a replica of the desired output from the power amplifier. Separately applying a spread-spectrum pilot to the reference signal and to the power amplifier path allows the relative amplitude and phase of the power amplifier's output to be tracked. In this manner, a phase-adjusted and/or amplitude-scaled version of the reference signal can be subtracted from that output, to create an error signal that has the desired transmit signal cancelled out and only contains the error signal information, i.e., residual distortion and noise.

Another spread-spectrum pilot signal can be applied to the output signal of the power amplifier and to the error signal so that phase/amplitude control of the error signal can be applied, via the second loop, to cancel the error signal from an interference-carrying signal in the power amplifier's output path or in a path coupled to the power amplifier output (e.g., in a receive path separated from the power amplifier by a duplexer). Thus, as described in further detail below, a pilot signal can be introduced to the main path and the error signal path of each of one or more cancellation loops, to facilitate phase/amplitude control of the error signal for optimal correction/cancellation.

In some cases, multiple pilot signals may be simultaneously needed in a given signal path, to capture separate information, such as in separate frequency regions. In this case, different spreading codes may be used to uniquely identify and separate the pilot signals, particularly when the pilot signals occupy overlapping frequency bands.

It will be recognized by those skilled in the art that there are many different places the pilot signal could be injected into the circuit, and likewise many points where the pilot signals could be detected. The decision of where to put injection and detection points implies many tradeoffs that are part of the overall radio system design. Several of these possible approaches are described in detail herein and illustrated in the attached figures. However, the illustrated embodiments should not be understood to limit the applicability of the techniques disclosed herein, as the same techniques may be applied to variations of the specifically illustrated circuits.

Figure 6:
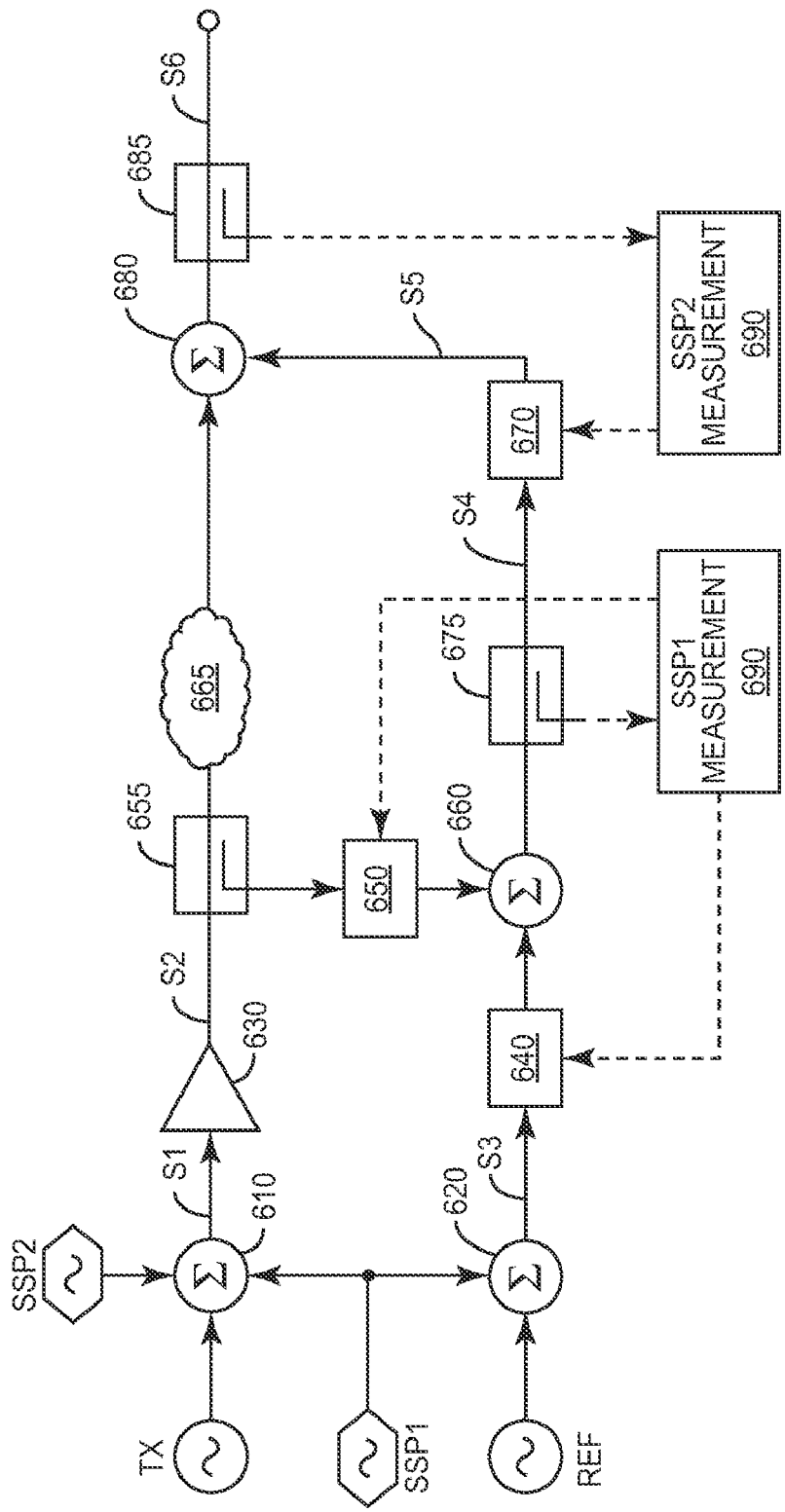
FIG. 6 is a schematic diagram illustrating an example circuit for reducing undesired emissions from a power amplifier in a radio transceiver.

FIG. 6 is a simplified schematic diagram of an example cancellation circuit 600, illustrating a signal flow applicable to several embodiments of the present invention. In this embodiment, a first spread-spectrum pilot signal, SSP1, is combined with a transmit signal, TX, using coupling circuit 610. In practice, combiner 610 could be a directional coupler, a summing amplifier, or any other device or circuit for coupling radio-frequency signals, including components that effectively add two signals together as well as components that "subtract" one signal from another.

The spread-spectrum pilot signal SSP1, in several embodiments, comprises a continuous-wave signal that has been spread, or "chipped," by a pseudo-random digital sequence. This spreading technique, which is commonly known as direct-sequence spread spectrum, creates a signal in which the CW pilot's energy is spread out over a bandwidth comparable to the chipping rate. With an appropriate spreading signal, the resulting bandwidth of the spread-spectrum pilot signal can be several Megahertz, or even tens of Megahertz.

In this embodiment, the purpose of SSP1 is to track the phase and amplitude differences between the power amplifier and cancellation signal paths in the first (leftmost) cancellation loop of FIG. 6. This allows the removal of a desired transmitter signal component, to produce an error signal that contains primarily unwanted distortion and noise. Because this first loop is designed to characterize in-band performance of the transmitter path, the spread-spectrum pilot signal is most effective if positioned in the transmitter band. Accordingly, in several embodiments the bandwidth of SSP1 is configured so that it at least partly overlaps the bandwidth of the desired transmitter signal. This is done by selecting a CW pilot (i.e., the pilot signal before spreading) at a frequency in or very near the transmitter frequency band.

A second spread-spectrum signal SSP2 is also combined with the TX signal, using combiner 610. (Those skilled in the art will appreciate that combiner 610 may comprise a four-port device, as suggested in FIG. 6, or two separate three-port devices.) As discussed in further detail below, this second spread-spectrum pilot signal may be used to characterize unwanted noise and distortion in a receiver frequency band. Thus, in several embodiments this spread-spectrum pilot signal SSP2 is designed to at least partly overlap a receiver frequency band. To allow for easy distinguishing between the two pilot signals, the spreading sequences used to create SSP1 and SSP2 may be selected from a group of spreading sequences that are orthogonal to one another, in some embodiments.

In the circuit configuration illustrated in FIG. 6, SSP1 is also combined with a reference signal REF, using combiner 620. As briefly discussed earlier, this reference signal REF is a replica of a desired, or expected, output of the power amplifier 630. This signal may look quite different than the TX signal, which may be pre-distorted to account in advance for the non-linear distortion introduced by power amplifier 630.

The result of combining REF and SSP1 is labeled signal S3, in FIG. 6. The summation of TX, SSP1 and SSP2 is labeled signal S1. As noted above, the signal TX itself is related to signal REF and may or may not be a pre-distorted version of REF.

Once signal S1 is amplified by the power amplifier 630, then the amplified signal S2 includes a distorted version of TX, plus additional noise and distortion introduced by the power amplifier 630. Thus, signal S2 includes a desired transmit signal component that resembles REF, as well as undesired distortion and noise. Signal S2 also includes amplified versions of SSP1 and SSP2. In general, because the spread-spectrum pilot signals SSP1 and SSP2 have peak amplitudes well below those of TX, the power amplifier output does not include significant distortion products of SSP1 and SSP2.

Circuit 640 controls the phase, amplitude, and or delay of signal S3, and may be configured to allow one or more of these parameters to be adjusted. For instance, circuit 640 may include a variable-gain amplifier, a variable-phase circuit, or a variable-delay circuit, or any combination of these. Likewise, circuit 650 similarly controls the phase, amplitude, and/or delay of a signal sample coupled from the power amplifier's output path at coupler 655, which may be a directional coupler, for example. If the output of circuit 640 is controlled so that the phase of the REF signal is opposite to the corresponding power amplifier output component at the output of 650, and so that the amplitudes of these two signals are the same, then the combining of these two signals in combiner 660 results in an error signal S4 that contains only the noise and distortion from PA, since REF is cancelled out. Of course, those skilled in the art will appreciate that combiner 660 can be a subtracting combiner, in some cases, in which case the outputs from circuits 640 and 650 should be controlled to be in-phase, rather than out-of-phase. Those skilled in the art will further appreciate that any of the phase, amplitude, or delay can be controlled in just one of circuits 640 and 650, in various embodiments, or in both, in other embodiments. In some embodiments, only one or two of these parameters is dynamically adjusted, while the remaining parameters are fixed. In others, all three parameters are dynamically adjustable to maximize the cancellation of the desired transmitter signal components from signal S4.

Only a small portion of signal S2 is expected to flow through circuit 650 from the output signal tap at coupler 655. The largest portion of signal S2 should travel through the remainder of the radio system's main transmitter path, which is represented in FIG. 6 as cloud 665. Cloud 665 may include a duplexer or other transmitter path components, elements of an antenna path, and/or components in a receiver signal path, in various embodiments. In any case, the signal at the output of cloud 665 comprises a replica of signal S2, with phase, amplitude, and delay changes introduced by coupler 655 and cloud 665. In some cases, such as where combiner 680 is positioned in a receiver path, the desired transmitter signal may be substantially attenuated, e.g., by a receive band filter. However, even in these cases the signal emerging from cloud 665 is nevertheless likely to carry a substantial portion of the unwanted noise and distortion introduced by power amplifier 630, such as receiver band noise and distortion that cannot be addressed by a receiver band filter.

As noted above, however, the error signal S4 output by combiner 660 consists primarily of the unwanted noise and distortion from power amplifier 630, since the desired signal has been canceled. Accordingly, if the phase and amplitude of this error signal are properly controlled, to match the phase, amplitude, and delay introduced in the power amplifier's output path by coupler 655 and cloud 665, then the adjusted error signal can be combined with the output of cloud 665, using combiner 680, to produce an interference-reduced signal S6 in which the unwanted distortion and noise is reduced. In the circuit illustrated in FIG. 6, this is done with circuit 670, which is configured to adjust one or more of the phase, amplitude, or delay of signal S4, to create a cancellation signal S5 that is out-of-phase with the output from cloud 665 and has a similar amplitude.

It will be understood to those skilled in radio-frequency circuit design that there are a number of methods and circuits for separating off portions of a signal, i.e., sampling a radio-frequency signal, or for combining radio-frequency signals. These circuits, which may collectively be regarded as coupling circuits, include, but are not limited to directional couplers, hybrid couplers, power combiners, and power splitters. Combiners 610, 620, 660, and 680 may each comprise one or more of these circuits, as may couplers 655, 675, and 685.

The phase, amplitude, and/or delay characteristics of the first loop are controlled by SSP1 measurement circuit 655, which is configured to dynamically adjust circuit 640, circuit 650, or both, based on detecting the presence of SSP1 in the error signal S4 output from combiner 660. Likewise, the phase, amplitude and/or delay characteristics of the second loop are controlled by SSP2 measurement circuit 690, which is configured to dynamically adjust circuit 670, based on detecting the presence of SSP2 in the interference-reduced signal S6 output from combiner 680.

Figure 7:
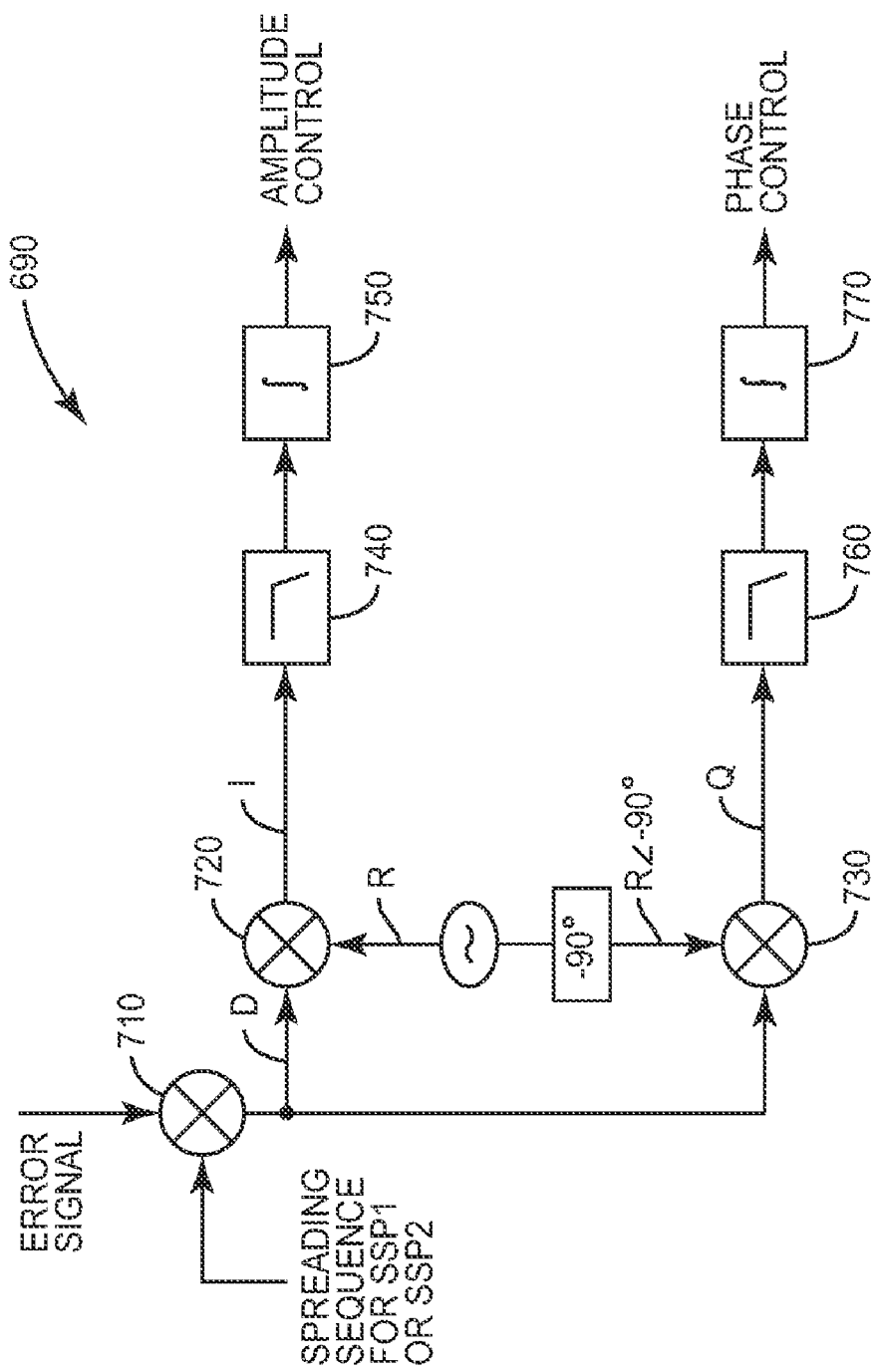
FIG. 7 is a schematic diagram illustrating an example circuit for measuring the presence of a spread-spectrum pilot signal in an error signal.

The basic function of these circuits is the same: to detect the presence of the respective spread-spectrum pilot signal in the error signal, and to provide adjustments to phase/amplitude/delay control circuits to minimize the presence of the pilot signal in the error signal. FIG. 7 illustrates one example of how such a spread-spectrum pilot measurement circuit might be configured. First, an error signal input, corresponding to error signal S4 or to interference-reduced signal S6, in FIG. 6, is "de-spread" by multiplying it, at multiplier 710, with the same spreading sequence used to create SSP1 or SSP2, as appropriate. This de-spreading operation has two effects. First, the distortion and noise components of the error signal are spread over a bandwidth comparable to the spreading sequence frequency. Second, any residual component of SSP1 or SSP2 in the error signal is de-spread, to form a CW tone that reflects the difference in magnitude and phase between the two signals that were combined to form the error signal.

This de-spread error signal is then multiplied by in-phase and quadrature replicas of the CW tone used to originally create SSP1 or SSP2, at multipliers 720 and 730. The in-phase result, labeled "I" in FIG. 7, is filtered at low-pass filter 740 and integrated at integrator 750, to produce an amplitude control signal. Similarly, the quadrature-phase result, labeled "Q" in FIG. 7, is filtered at low-pass filter 760 and integrated at integrator 770, to produce a phase control signal. The amplitude control signal and the phase control signal can be applied to variable-gain and variable-phase circuits, respectively, to adjust the amplitude and phase of the cancellation loop.

The function of the circuit illustrated in FIG. 7 is to perform an energy measurement of the spread-spectrum pilot signal, in the cartesian coordinate plane. The cartesian coordinate plane is defined by a I/Q split reference signal applied to multipliers 720 and 730. This circuit can also be regarded as an I/Q demodulator or a matched filter correlator. For proper operation, it is assumed that the time alignment (delay) between the CW tones at multipliers 720 and 730 and the error signal are set properly, using delay elements that are not shown.

Given that assumption, the CW tone input to multiplier 720 takes the form R=cos($\omega$t), while the de-spread error signal has the form D=cos($\omega$t)–A cos($\omega$t+$\phi$). A represents the gain of the cancellation loop, while $\phi$ is the phase of the loop. $\omega$ is the angular frequency of the CW tone. Then:

$$I = \cos^2(\omega t) - \frac{A}{2}\cos(2\omega t + \varphi) - \frac{A}{2}\cos\varphi$$
$$= \frac{1}{2} - \frac{A}{2}\cos\varphi$$
$$= \frac{1}{2}[1 - A\cos\varphi],$$

and:

$$Q = \sin(\omega t)\cos(\omega t) - A\sin(\omega t)\cos(\omega t + \varphi)$$
$$= -\frac{A}{2}\sin\varphi.$$

For small angles $\phi$, signals I and Q can be integrated by integrators 770 and 790 to yield amplitude and phase control signals, respectively. The easy integration is possible due to the fact that when the system is settled the angle $\phi$ is equal to zero, while the amplitude A is equal to 1. Of course, the dynamics of this control system are affected by the phase and amplitude responses of the corresponding loop, as a function of frequency and power. The loop filters and integrators in FIG. 7 can be readily designed to accommodate these dynamics, using techniques well known to those conversant in control theory. Of course, other techniques for measuring the presence of the spread-spectrum pilot signal in the error signal, including digital techniques in which the error signal is digitized and analyzed to detect the amplitude and/or phase of any residual portion of the spread-spectrum pilot signal. A digital implementation provides a great degree of flexibility in defining and implementing the control problem, which can be viewed as an optimization (e.g., minimization) of the presence of the pilot signal in the error signal. Hence, well-known optimization algorithms such as gradient descent or simplex method may be applied. Techniques for adaptive filtering, such as Kalman filters or similar techniques, might also be applied.

Figure 8:
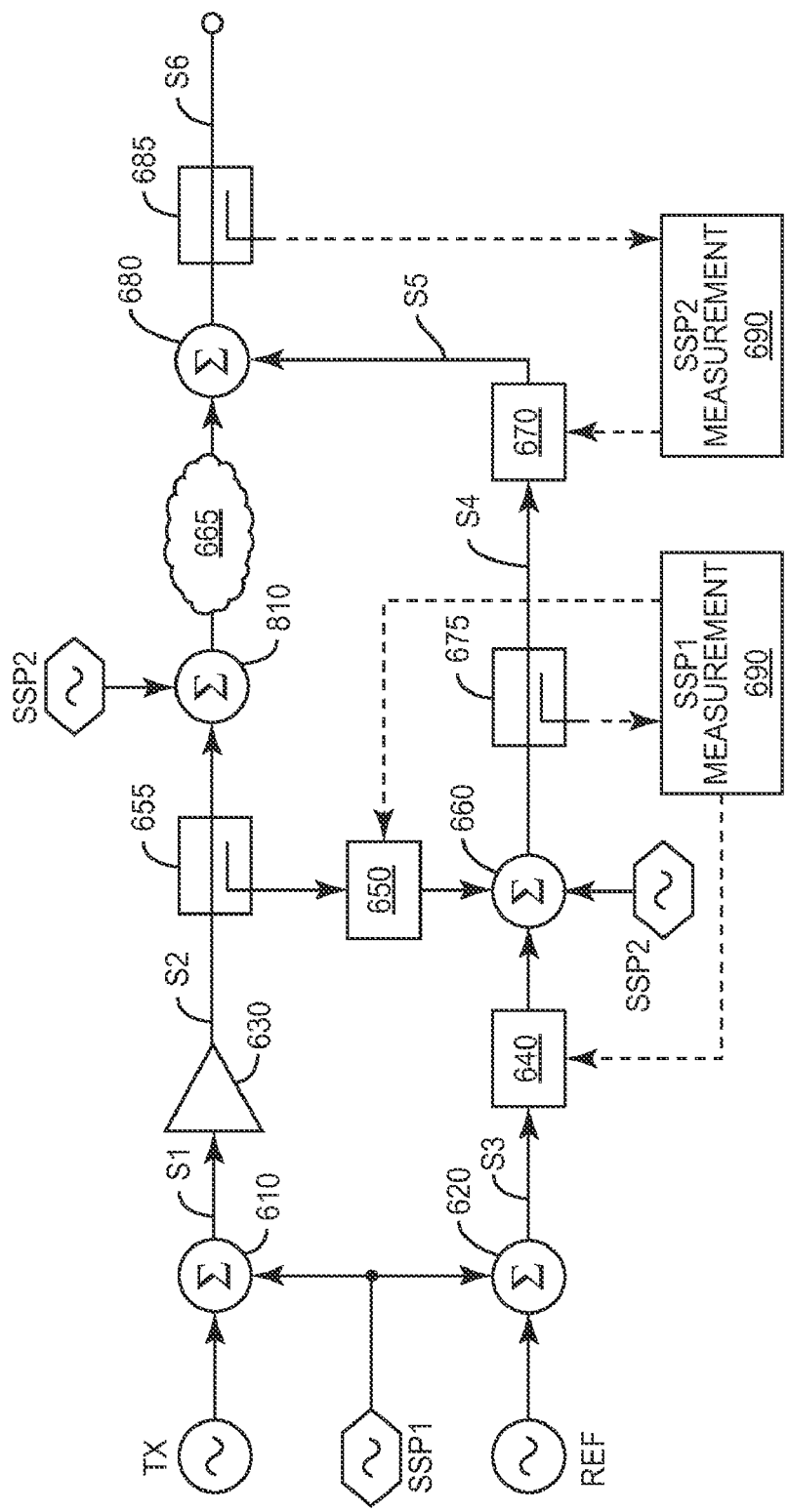
FIGS. 8-12 are each schematic diagrams illustrating example circuits for reducing undesired emissions from a power amplifier in a radio transceiver.
Figure 9:
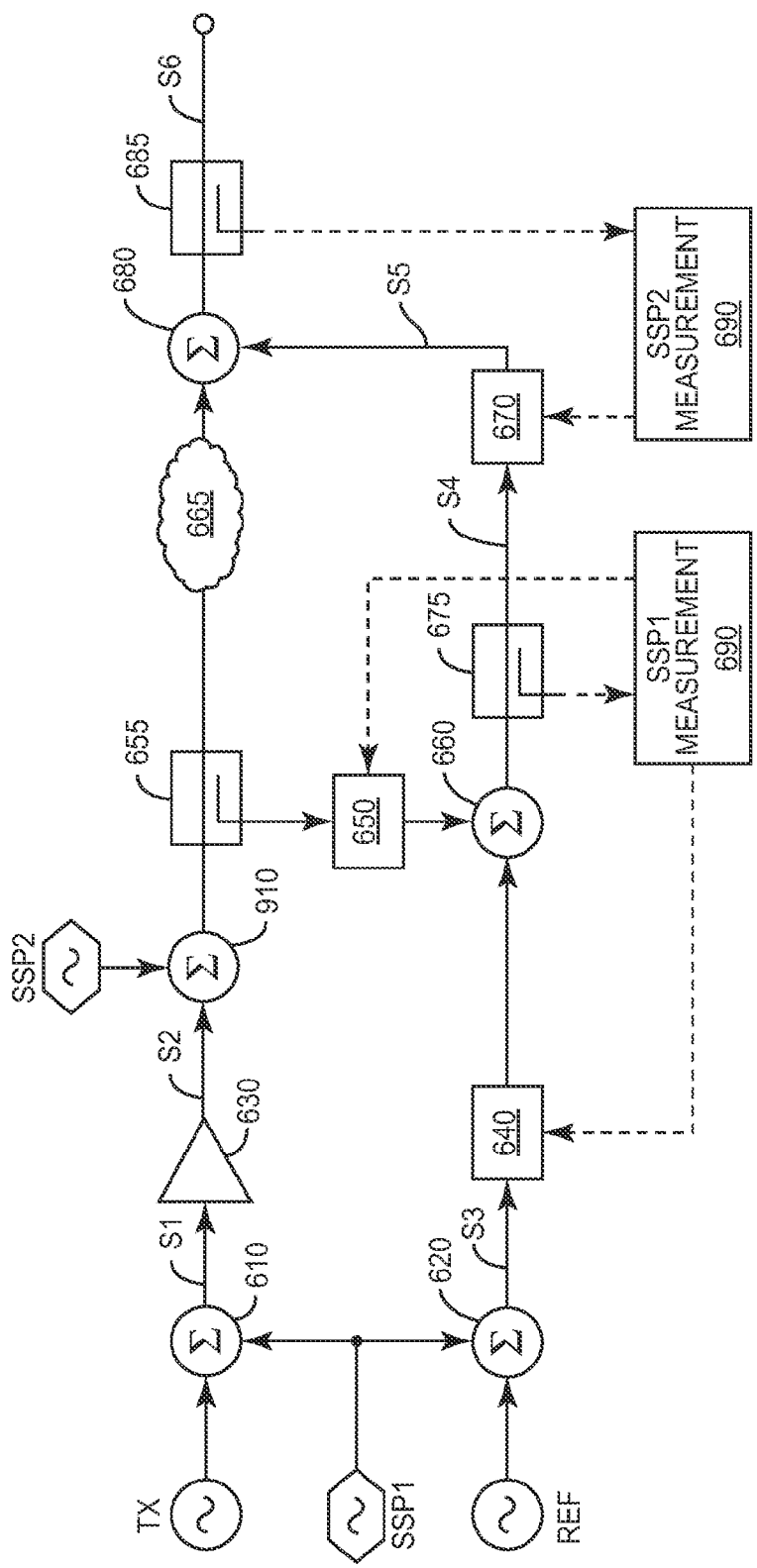

As was noted earlier, it is possible to inject the spread-spectrum pilot signal(s) at several places in any given cancellation circuit configuration. For example, FIG. 8 illustrates a cancellation circuit having the same general configuration as that of FIG. 6. However, in the circuit of FIG. 8, the spread-spectrum pilot SSP2 is introduced after the sampling of the power amplifier's output signal at coupler 655, using an additional coupler 810. Because SSP2 is not present in the sampled signal path in this case, it must also be injected into the error signal, via combining circuit 660. In another embodiment, shown in FIG. 9, spread spectrum pilot SSP2 is injected into the power amplifier's output path via a coupler 910 positioned at the output of power amplifier 630, but before the output signal tap at coupler 655.

Figure 10:
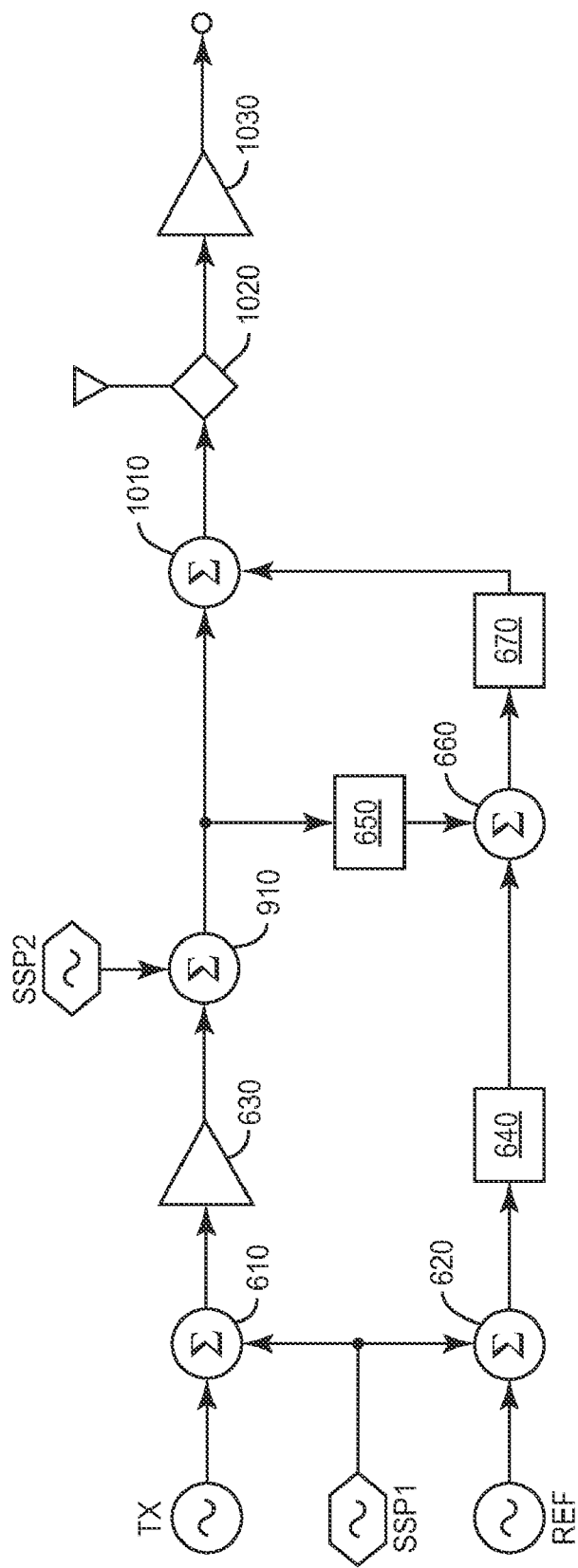

The cancellation of unwanted noise and distortion can also be positioned at several different places in a transceiver circuit. For instance, in FIG. 10, the cancellation circuit is configured to cancel emissions before the antenna of a radio system. Thus, the combining of the error signal with the power amplifier's output signal is performed at combiner 1010, which is positioned between the power amplifier 630 and a duplexer 1020. This configuration also reduces transmitter emissions leaking through duplexer 1020 to receiver low-noise amplifier 1030. Note that FIG. 10 and subsequent figures omit for clarity several features pictured in earlier figures, such as the spread-spectrum pilot measurement circuits; the location and configuration of these missing details will be apparent given the more detailed diagrams in FIGS. 6, 8, and 9.

Figure 11:
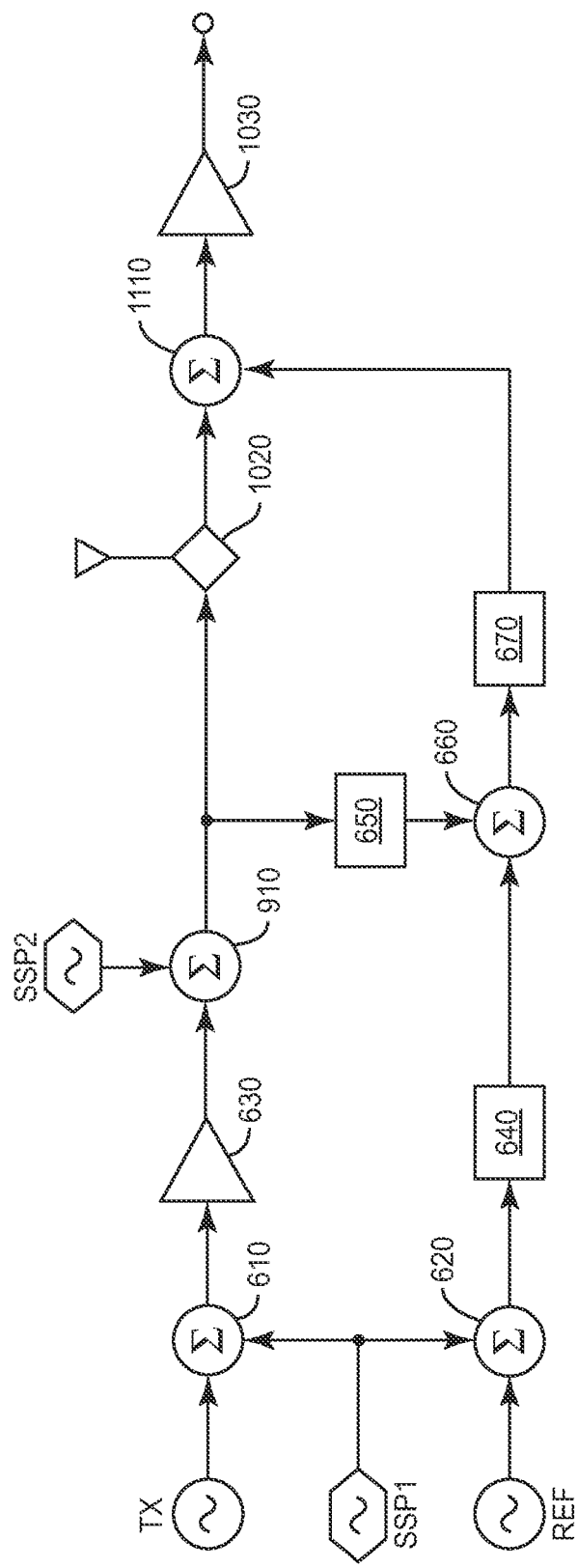

In another approach, shown in FIG. 11, the cancellation loop is instead used to cancel emissions after the antenna duplexer 1020, via combiner 1110, but before the low-noise amplifier 1030 on the receiver side of the transceiver system. In other embodiments, the cancellation could instead be positioned after the low-noise amplifier 1030.

Figure 12:
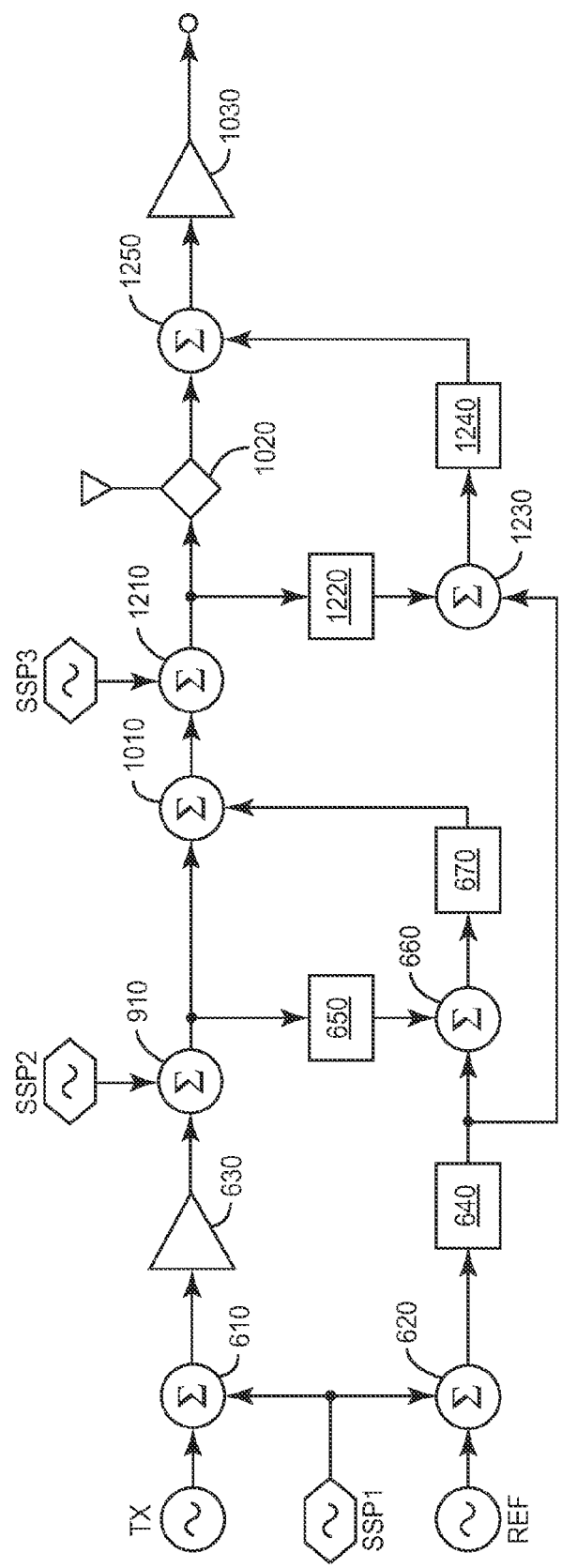

In still another embodiment, shown in FIG. 12, two interference cancellation loops are used, in addition to the first loop used to generate the error signal. The first cancellation loop is used to cancel emissions before the antenna on the transmit side of the radio system, in the same manner illustrated in FIG. 10. A second cancellation loop is also used, to further cancel emissions after the antenna on the receiver side of the radio system. In the pictured circuit, a third spread-spectrum pilot SSP3 is used, and injected into the second interference-cancelling loop via combiner 1210. The second interference-cancelling loop further includes phase/amplitude circuits 1220 and 1240, the latter of which may be used in some embodiments to adjust the phase and/or amplitude of a second error signal provided via combiner 1230. The second cancellation is performed at combiner 1250, just before low-noise amplifier 1250. Not shown is a measurement circuit like those in FIGS. 6, 8, and 9; the omitted measurement circuit should be configured to measure the presence of SSP3 in the output of combiner 1250 (either before or after low-noise amplifier 1030) and to adjust the phase, amplitude, or delay of the loop via circuits 1220 and/or 1240.

The pilot SSP3 could be the same source as SSP2, since the first instance of SSP2 would be cancelled in the main path by the correction process. Alternatively SSP3 could be a new spread-spectrum pilot using a different spreading code, in which case SSP3 could be detected independently using spread spectrum techniques and SSP2 would not interfere with SSP3 should any residual of SSP2 not be cancelled out through some error in the correction loop. Note that it is also possible for SSP2 and SSP3 to be positioned to cover different frequency ranges, to optimize cancellation of unwanted emissions at different points of the frequency spectrum.

Figure 13:
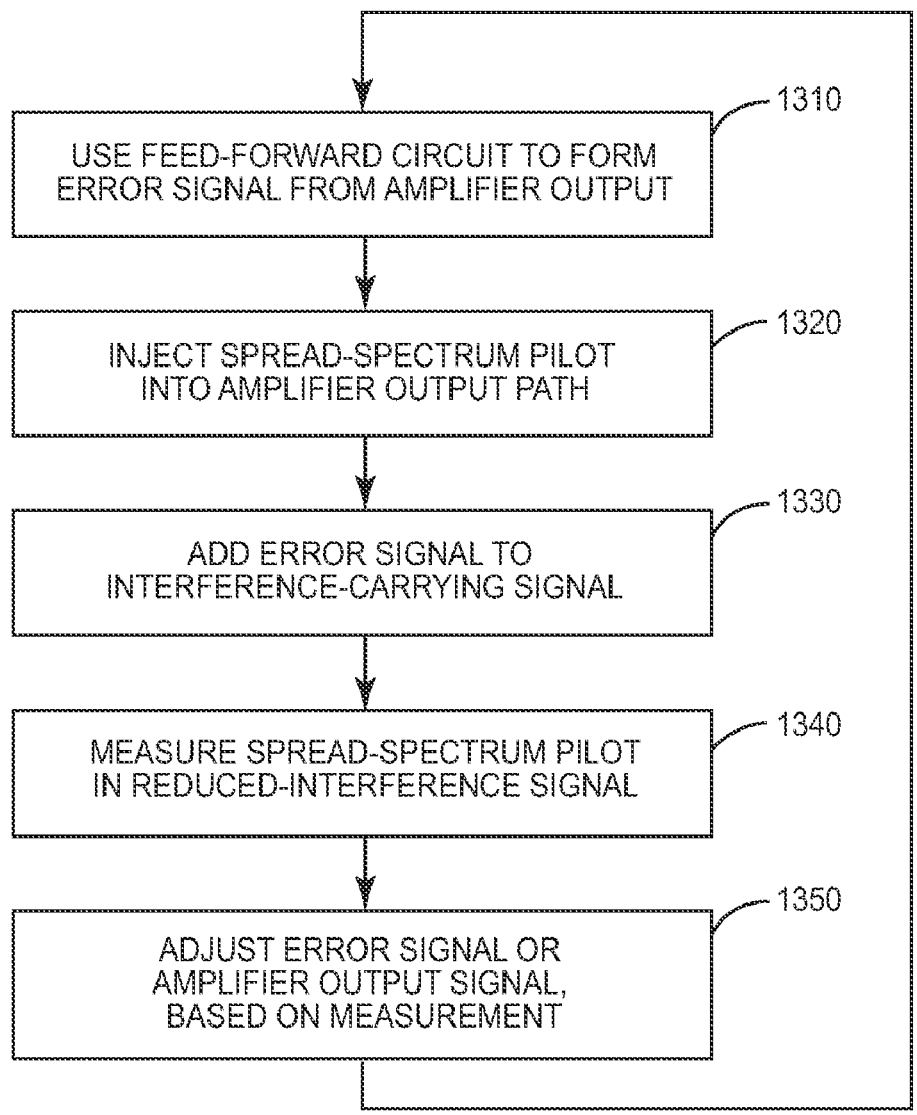
FIG. 13 is a process flow diagram illustrating an example method for reducing undesired emissions from a power amplifier in a radio transceiver.

The circuits of FIGS. 6-12 comprise example implementations of several techniques for reducing undesired emissions from a power amplifier in a communications transceiver. These techniques can alternatively be embodied as methods or processes. For instance, an example method for reducing undesired emissions from a power amplifier in a communications transceiver is illustrated in FIG. 13. The first "step" is shown at block 1310, and includes subtracting all or part of a desired transmitter-signal component from a sampled signal coupled from the power amplifier's output signal path, to create an error signal. (Note that while the current discussion characterizes various operations as "steps," this is not meant to imply that these operations are carried out in a particular order. In fact, it will be apparent to those skilled in the art that many of these operations are in fact carried out simultaneously.) This step corresponds to the leftmost loop in the circuits illustrated in FIGS. 6 and 8-12.

Figure 14:
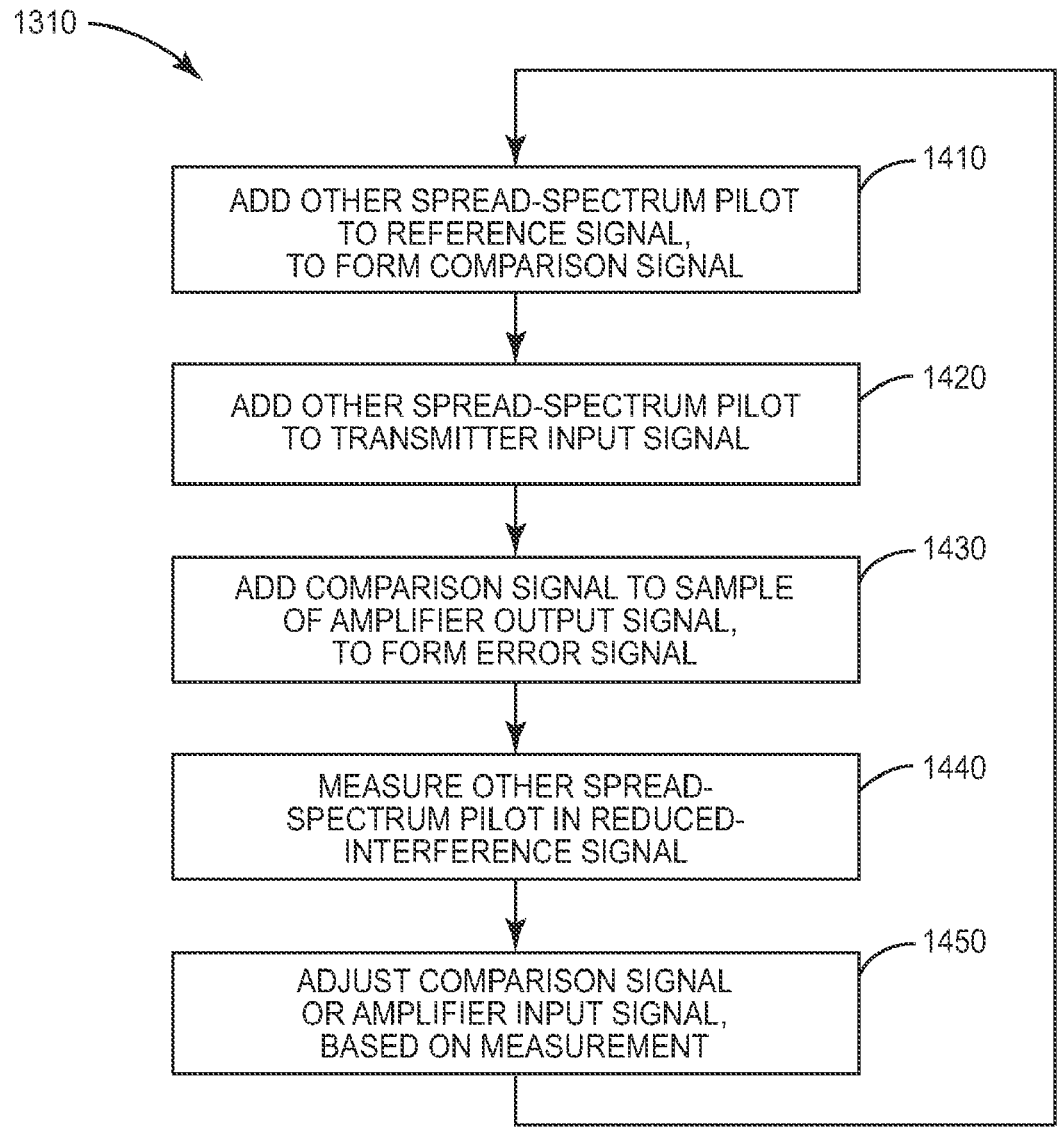
FIG. 14 is a process flow diagram illustrating details of a process for forming an error signal.

Although a spread-spectrum pilot need not be used in this first loop in every embodiment, in some embodiments this subtraction operation follows the process illustrated in FIG. 14, which comprises adding a spread-spectrum pilot signal to a reference signal that represents a desired output from the power amplifier, to form a comparison signal, as shown at block 1410; adding the second spread-spectrum pilot signal to a modulated transmitter signal, to form an input signal for the power amplifier, as shown at block 1420; adding the comparison signal to the sampled signal, to form the error signal, as shown at block 1430; measuring the spread-spectrum pilot signal in the error signal, as shown at block 1440; and adjusting at least one parameter of the comparison signal or the input signal to the power amplifier, based on this measurement, to reduce the presence of the reference signal in the error signal, as shown at block 1440. In several embodiments, the spread-spectrum pilot signal occupies a bandwidth at least partly overlapping the bandwidth occupied by the reference signal, to facilitate accurate characterization of the loop's response at the transmitter frequency.

Referring back to FIG. 13, the next step in the cancellation process according to the pictured method is to inject a spread-spectrum pilot signal into the power amplifier's output signal path and into the error signal, as shown at block 1320. This spread-spectrum pilot signal occupies a bandwidth at least partially overlapping a receiver band of the communications transceiver, to facilitate an accurate characterization of the cancellation loop's response at the receive frequency. In some embodiments, as discussed earlier, the spread-spectrum signal comprises a pilot base signal (e.g., a continuous-wave tone) multiplied by a spreading sequence. However, other structures for the spread-spectrum pilot signal are possible, including those in which the pilot base signal is a modulated signal, rather than a CW tone.

The spread-spectrum pilot signal can be injected into the power amplifier's output signal path in several ways. For instance, it can be coupled to an input signal to the power amplifier, or added to the power amplifier's output signal path at a point after the sampled signal is coupled from the power amplifier's output signal path. In other embodiments, the spread-spectrum pilot signal is added to the power amplifier's output signal path at a point after the power amplifier but before the sampled signal is coupled from the power amplifier's output signal path.

Next, as shown at block 1330, the error signal produced by the preceding operations is added to an interference-carrying signal to form a reduced-interference signal, wherein the interference-carrying signal is in the power amplifier's output signal path or is coupled to the power amplifier's output signal path. For instance, in some embodiments the error signal is added to a receive-path signal coupled to the power amplifier's output signal path by a duplexer circuit, to form the reduced-interference signal. In others, the error signal is added to the power amplifier's output signal path, to form the reduced-interference signal, at a point before a duplexer circuit.

The method further comprises measuring the first spread-spectrum signal in the reduced-interference signal, as shown at block 1340. In some embodiments, this comprises de-spreading the reduced-interference signal, using the spreading sequence used to create the spread-spectrum pilot signal, and detecting a peak magnitude in the de-spread signal. Based on the measurement, at least one parameter of the first error signal or the power amplifier output signal is adjusted, as shown at block 1350, to reduce the presence of the first error signal in the reduced-interference signal. This at least one parameter that is adjusted can include one or more of the signal phase, the signal amplitude, and the signal delay. Thus, for example, a variable gain amplifier may be adjusted, in some embodiments, while a variable-phase element is adjusted in another. In some embodiments, both are simultaneously adjusted.

Figure 15:
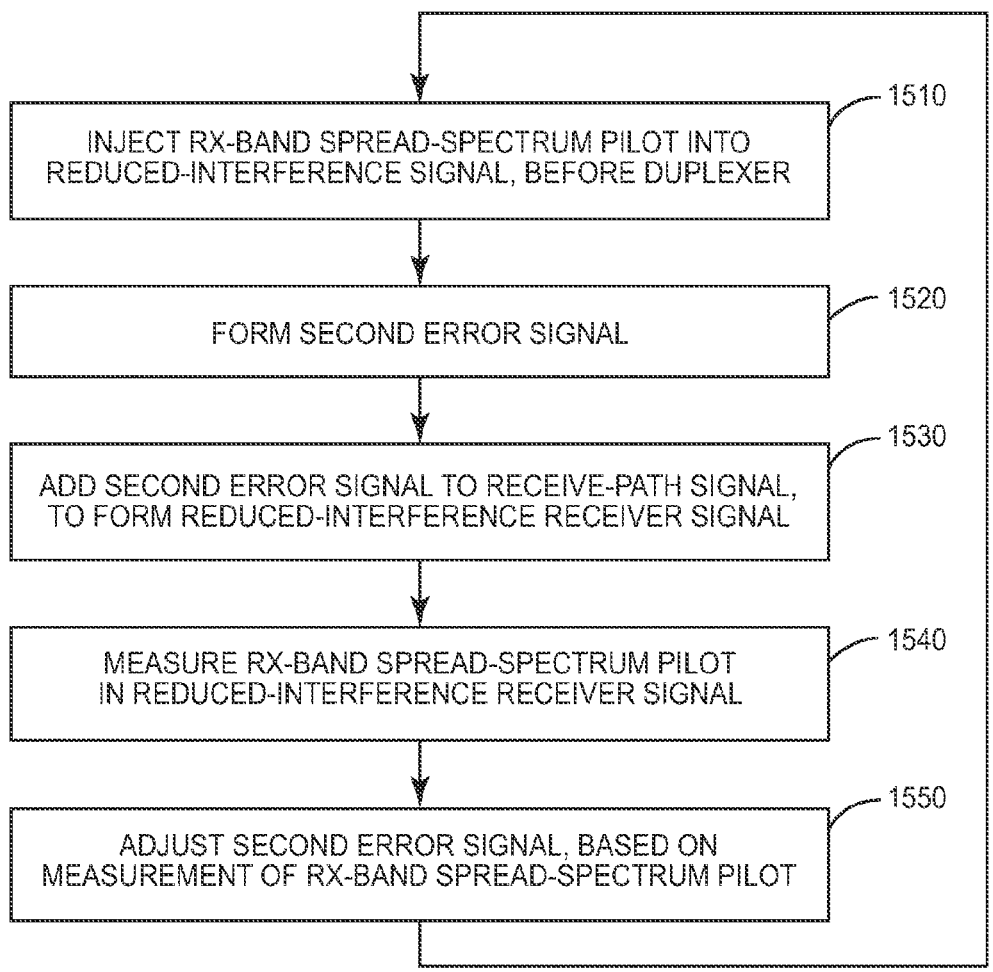
FIG. 15 is a process flow diagram illustrating further details of an example method for reducing undesired emissions from a power amplifier in a radio transceiver
Figure 6:
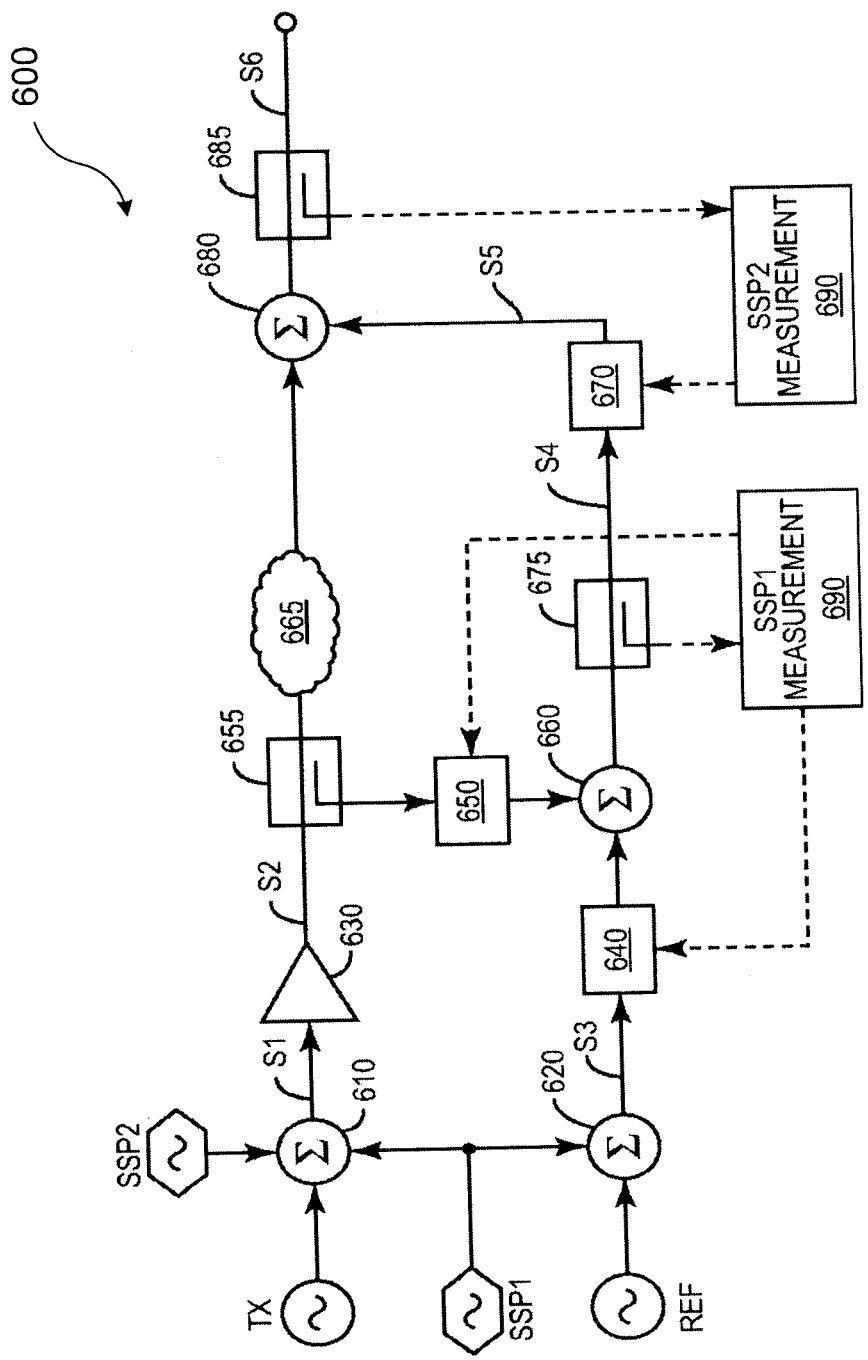

FIG. 15 illustrates the operations associated with the use of a second cancellation loop, for multi-loop cancellation, as was illustrated in the schematic diagram of FIG. 12. The operations of FIG. 15 may be carried out in conjunction with those of FIG. 13, and include, as shown at block 1510, injecting a third spread-spectrum pilot signal into the reduced-interference signal, at a point before the duplexer circuit. A second error signal is then formed by subtracting all or part of the desired transmitter-signal component from a second sampled signal coupled from the power amplifier's output signal path at a point after the injection of the second spread-spectrum pilot signal, as shown at block 1520. This second error signal is added to a receive-path signal coupled to the power amplifier's output signal path by a duplexer circuit, to form a reduced-interference receiver signal, as shown at block 1530, and the second spread-spectrum pilot signal is measured in the reduced-interference receiver signal, as shown at block 1540. Based on this measuring, at least one parameter of the second error signal is adjusted, to reduce the presence of power amplifier emissions in the reduced-interference receiver signal.

It will be understood by those skilled in the art that the methods and circuits described above for using spread-spectrum pilot signals for reducing interference are also applicable to radio systems where separate antennas are used for receive and transmit signals. Further, it will be appreciated by those skilled in the art that the schematic diagrams of FIGS. 6-11 are necessarily simplified, to clarify the presentation of the inventive techniques disclosed herein, and do not include, for example, delay elements that might be necessary or details of the phase changes and amplitude adjustments. While such elements are necessary for correct operation of the circuit, the precise nature of those elements is highly dependent on the intended frequency of operation, power level and other parameters relevant to the application of a radio system. Moreover, the techniques for designing and implementing these features are well known to those skilled in the art of radio transceiver design.

Although the present inventive techniques are generally described above in the context of a radio transceiver, those skilled in the art will appreciate that these techniques are more generally applicable to communications transceivers utilizing a power amplifier. Indeed, given the above variations and examples in mind, those skilled in the art will appreciate that the preceding descriptions of various embodiments of methods and circuits are given only for purposes of illustration and example. One or more of the specific processes discussed above may be carried out in a cellular phone or other communications transceiver comprising one or more appropriately configured processing circuits, which may in some embodiments be embodied in one or more application-specific integrated circuits (ASICs). In some embodiments, these processing circuits may comprise one or more microprocessors, microcontrollers, and/or digital signal processors programmed with appropriate software and/or firmware to carry out one or more of the operations described above, or variants thereof. In some embodiments, these processing circuits may comprise customized hardware to carry out one or more of the functions described above. Those skilled in the art will recognize, of course, that the present invention may be carried out in other ways than those specifically set forth herein without departing from essential characteristics of the invention. The present embodiments are thus to be considered in all respects as illustrative and not restrictive, and all changes coming within the meaning and equivalency range of the appended claims are intended to be embraced therein.

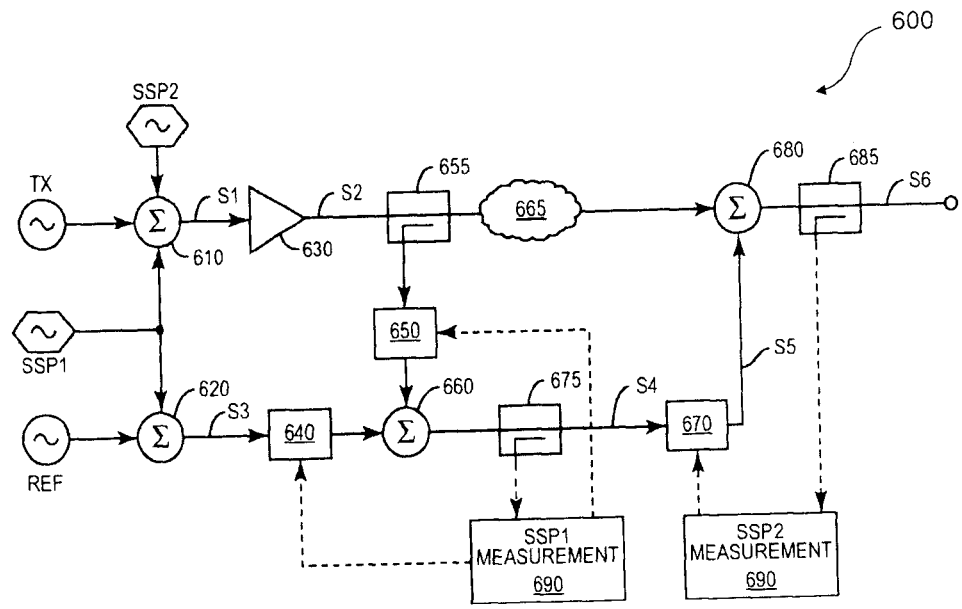

What is claimed is:

1. A method for reducing undesired emissions from a power amplifier in a communications transceiver, the method comprising:

using a feed-forward circuit, subtracting all or part of a desired transmitter-signal component from a first sampled signal coupled from the power amplifier's output signal path, to create a first error signal;

injecting a first spread-spectrum pilot signal into the power amplifier's output signal path and into the first error signal, wherein the first spread-spectrum pilot signal occupies a first bandwidth at least partially overlapping a receiver band of the communications transceiver;

adding the first error signal to an interference-carrying signal to form a reduced-interference signal, wherein the interference-carrying signal is in the power amplifier's output signal path or is coupled to the power amplifier's output signal path;

measuring the first spread-spectrum pilot signal in the reduced-interference signal; and adjusting at least one parameter of the first error signal or the power amplifier output signal, based on the measuring of the first spread-spectrum pilot signal, to reduce the presence of the first error signal in the reduced-interference signal.

2. The method of claim 1, wherein the at least one parameter of the first error signal or the power amplifier signal comprises one or more of a signal phase, a signal amplitude, and a signal delay.

3. The method of claim 1, wherein using a feed-forward circuit to subtract all or part of the desired transmitter-signal component from the first sampled signal comprises:
adding a second spread-spectrum pilot signal to a reference signal that represents a desired output from the power amplifier, to form a first comparison signal, wherein the second spread-spectrum pilot signal occupies a second bandwidth at least partly overlapping the bandwidth occupied by the reference signal;
adding the second spread-spectrum pilot signal to a modulated transmitter signal, to form an input signal for the power amplifier;
adding the first comparison signal to the first sampled signal, to form the first error signal;
measuring the second spread-spectrum pilot signal in the first error signal; and
adjusting at least one parameter of the first comparison signal or the input signal to the power amplifier, based on the measuring of the second spread-spectrum pilot signal, to reduce the presence of the reference signal in the first error signal.

4. The method of claim 3, wherein the at least one parameter of the first comparison signal or the input signal to the power amplifier comprises one or more of a signal phase, a signal amplitude, and a signal delay.

5. The method of claim 1, wherein the first spread-spectrum signal comprises a pilot base signal multiplied by a spreading sequence and wherein measuring the first spread-spectrum signal in the reduced-interference signal comprises de-spreading the reduced-interference signal, using the spreading sequence, and detecting a peak magnitude in the de-spread signal.

6. The method of claim 1, wherein injecting the first spread-spectrum pilot signal into the power amplifier's output signal path comprises adding the first spread-spectrum pilot signal to an input signal to the power amplifier.

7. The method of claim 1, wherein injecting the first spread-spectrum pilot signal into the power amplifier's output signal path comprises adding the first spread-spectrum pilot signal to the power amplifier's output signal path at a point after the first sampled signal is coupled from the power amplifier's output signal path.

8. The method of claim 1, wherein injecting the first spread-spectrum pilot signal into the power amplifier's output signal path comprises adding the first spread-spectrum pilot signal to the power amplifier's output signal path at a point before the first sampled signal is coupled from the power amplifier's output signal path.

9. The method of claim 1, wherein the first error signal is added to a receive-path signal coupled to the power amplifier's output signal path by a duplexer circuit, to form the reduced-interference signal.

10. The method of claim 1, wherein the first error signal is added to the power amplifier's output signal path, to form the reduced-interference signal, at a point before a duplexer circuit.

11. The method of claim 10, further comprising:
injecting a second spread-spectrum pilot signal into the reduced-interference signal, at a point before the duplexer circuit;
forming a second error signal by subtracting all or part of the desired transmitter-signal component from a second sampled signal coupled from the power amplifier's output signal path at a point after the injection of the second spread-spectrum pilot signal;
adding the second error signal to a receive-path signal coupled to the power amplifier's output signal path by a duplexer circuit, to form a reduced-interference receiver signal;
measuring the second spread-spectrum pilot signal in the reduced-interference receiver signal; and
adjusting at least one parameter of the second error signal, based on the measuring of the second spread-spectrum pilot signal, to reduce the presence of power amplifier emissions in the reduced-interference receiver signal.

12. A circuit for reducing undesired emissions from a power amplifier in a communications transceiver, the circuit comprising:
a first feed-forward circuit loop comprising the power amplifier, a sampling circuit configured to couple a first sampled signal from the power amplifier's output signal path, and a first cancellation circuit configured to subtract all or part of a desired transmitter-signal component from the first sampled signal, to create a first error signal;
a first coupling circuit configured to inject a first spread-spectrum pilot signal into the power amplifier's output signal path and into the first error signal, wherein the first spread-spectrum pilot signal occupies a first bandwidth at least partially overlapping a receiver band of the communications transceiver;
a first adder circuit configured to add the first error signal to an interference-carrying signal either in the power amplifier's output signal path or coupled to the power amplifier's output signal path, to form a reduced-interference signal;
a first pilot detection circuit configured to measure the first spread-spectrum pilot signal in the reduced-interference signal; and
a first signal adjustment circuit configured to adjust at least one parameter of the first error signal or the power amplifier output signal, based on the measuring of the first spread-spectrum pilot signal, to reduce the presence of the first error signal in the reduced-interference signal.

13. The circuit of claim 12, wherein the first signal adjustment circuit is configured to adjust one or more of a signal phase, a signal amplitude, and a signal delay.

14. The circuit of claim 12, wherein the first feed-forward circuit loop comprises:
a second adder circuit configured to add a second spread-spectrum pilot signal to a reference signal that represents a desired output from the power amplifier, to form a first comparison signal, wherein the second spread-spectrum pilot signal occupies a second bandwidth at least partly overlapping the bandwidth occupied by the reference signal;
a third adder circuit configured to add the second spread-spectrum pilot signal to a modulated transmitter signal, to form an input signal for the power amplifier;
a fourth adder circuit configured to add the first comparison signal to the first sampled signal, to form the first error signal;
a second pilot detection circuit configured to measure the second spread-spectrum pilot signal in the first error signal; and
a second signal adjustment circuit configured to adjust at least one parameter of the first comparison signal or the input signal to the power amplifier, based on the measuring of the second spread-spectrum pilot signal, to reduce the presence of the reference signal in the first error signal.

15. The circuit of claim 14, wherein the second signal adjustment circuit is configured to adjust one or more of a signal phase, a signal amplitude, and a signal delay.

16. The circuit of claim 12, wherein the first spread-spectrum signal comprises a pilot base signal multiplied by a spreading sequence and wherein the first pilot detection circuit comprises a multiplier circuit configured to de-spread the reduced-interference signal, using the spreading sequence, and a peak-detection circuit configured to detect a peak magnitude in the de-spread signal.

17. The circuit of claim 12, wherein the first coupling circuit comprises a summing circuit configured to add the first spread-spectrum pilot signal to an input signal to the power amplifier.

18. The circuit of claim 12, wherein the first coupling circuit comprises a summing circuit configured to add the first spread-spectrum pilot signal to the power amplifier's output signal path at a point after the first sampled signal is coupled from the power amplifier's output signal path.

19. The circuit of claim 12, wherein the first coupling circuit comprises a summing circuit configured to add the first spread-spectrum pilot signal to the power amplifier's output signal path at a point before the first sampled signal is coupled from the power amplifier's output signal path.

20. The circuit of claim 12, further comprising a duplexer circuit coupling the power amplifier's output path to an antenna signal path and to a receiver path, wherein the first coupling circuit comprises a summing circuit configured to add the first error signal to a receive-path signal in the receiver path, to form the reduced-interference signal.

21. The circuit of claim 12, further comprising a duplexer circuit coupling the power amplifier's output path to an antenna signal path and to a receiver path, wherein the first adder circuit is configured to add the first error signal to the power amplifier's output signal path, to form the reduced-interference signal, at a point before the duplexer circuit.

22. The circuit of claim 21, further comprising:
a second coupling circuit configured to inject a second spread-spectrum pilot signal into the reduced-interference signal, at a point before the duplexer circuit;
a second cancellation circuit configured to generate a second error signal by subtracting all or part of the desired transmitter-signal component from a second sampled signal coupled from the power amplifier's output signal path at a point after the injection of the second spread-spectrum pilot signal;
a summing circuit configured to add the second error signal to a receive-path signal in the receiver path, to form a reduced-interference receiver signal;
a second pilot detection configured to measure the second spread-spectrum pilot signal in the reduced-interference receiver signal; and
a second signal adjustment circuit configured to adjust at least one parameter of the second error signal, based on the measuring of the second spread-spectrum pilot signal, to reduce the presence of power amplifier emissions in the reduced-interference receiver signal.

* * * * *

UNITED STATES PATENT AND TRADEMARK OFFICE
CERTIFICATE OF CORRECTION

PATENT NO. : 8,379,699 B2  
APPLICATION NO. : 13/046107  
DATED : February 19, 2013  
INVENTOR(S) : Smiley Page 1 of 4

It is certified that error appears in the above-identified patent and that said Letters Patent is hereby corrected as shown below:

The title page showing the illustrative figure should be deleted to be replaced with the attached title page.

On the Title Page, item (75), under "Inventor", in Column 1, Line 1, delete "Russell" and insert -- Russell Clifford --, therefor.

On the Title Page, item (56), under "OTHER PUBLICATIONS", in Column 2, Line 1, delete ""Adadptive" and insert -- "Adaptive --, therefor.

In the drawing sheets, consisting of Fig. 6, should be deleted to be replaced with the drawing sheet, consisting of Fig. 6, as shown on the attached pages.

In the Specifications:

In Column 3, Line 2, delete "duplexer 320" and insert -- duplexer 310 --, therefor.

In Column 4, Line 62, delete "transceiver" and insert -- transceiver. --, therefor.

In Column 8, Line 54, delete "and or" and insert -- and/or --, therefor.

In Column 8, Line 65, delete "of 650," and insert -- of circuit 650, --, therefor.

In Column 9, Line 57, delete "655," and insert -- 690, --, therefor.

In Column 10, Line 42, delete "($\omega t+\phi$)." and insert -- ($\omega t+\varphi$). --, therefor.

In Column 10, Line 43, delete "$\phi$" and insert -- $\varphi$ --, therefor.

Signed and Sealed this  
Thirteenth Day of August, 2013

Teresa Stanek Rea  
*Acting Director of the United States Patent and Trademark Office*

CERTIFICATE OF CORRECTION (continued)
U.S. Pat. No. 8,379,699 B2

In Column 10, Line 62, delete "ф," and insert -- φ, --, therefor.

In Column 10, Line 63, delete "770 and 790" and insert -- 750 and 770 --, therefor.

In Column 10, Line 65, delete "ф" and insert -- φ --, therefor.

In Column 12, Line 1, delete "1250." and insert -- 1030. --, therefor.

CERTIFICATE OF CORRECTION (continued)

(12) United States Patent
Smiley

(10) Patent No.: US 8,379,699 B2
(45) Date of Patent: Feb. 19, 2013

(54) SPREAD SPECTRUM PILOT SIGNALS IN AN ELECTRONIC DUPLEXER

(75) Inventor: Russell Smiley, Richmond (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 141 days.

(21) Appl. No.: 13/046,107

(22) Filed: Mar. 11, 2011

(65) Prior Publication Data

US 2012/0230368 A1    Sep. 13, 2012

(51) Int. Cl.
H04B 1/38    (2006.01)

(52) U.S. Cl. ........ 375/219; 375/316; 375/295; 375/297; 455/114.1; 455/63.1; 330/151; 330/149

(58) Field of Classification Search .............. 375/219, 375/316, 295, 297; 330/151, 149; 455/114.1, 455/63.1
See application file for complete search history.

(56) References Cited

U.S. PATENT DOCUMENTS

| | | |
|---|---|---|
| 5,386,198 A | 1/1995 | Ripstrand et al. |
| 6,081,549 A | 6/2000 | Shou et al. |
| 7,595,689 B1 | 9/2009 | Kenington |
| 7,702,295 B1 | 4/2010 | Nicholls et al. |

FOREIGN PATENT DOCUMENTS

GB    2273622 A    6/1994

OTHER PUBLICATIONS

O'Sullivan, Tomás, "Adadptive Duplexer Implemented Using Single-Path and Multipath Feedforward Techniques with BST Phase Shifters", IEEE Transactions on Microwave Theory and Techniques, vol. 53, No. 1, Jan. 2005.
Roussel, A., et al., "Frequency Agile Bandstop Filter (FABSF)", Microwave Symposium Digest; IEEE MTT-S International, Jun. 15, 2008, pp. 1099-1102, XP031441518.
Choi, H., et al., "Digital Controlled Co-channel Feedback Interference Cancellation System with Broadband Cancellation", Proceedings of the 1st European Wireless Technology Conference; IEEE, Oct. 27, 2008, pp. 194-197, Amsterdam, NL, XP031408507.

*Primary Examiner* — Zewdu Kassa
(74) *Attorney, Agent, or Firm* — Coats & Bennett, P.L.L.C.

(57) ABSTRACT

Interference-reducing circuits include a feed-forward circuit for subtracting all or part of a desired transmitter-signal component from a signal coupled from the power amplifier's output path. The error signal from this feed-forward circuit contains a replica of distortion in the power amplifier output. A cancellation loop adjusts the phase and/or amplitude of this error signal and combines this adjusted error signal with an interference-carrying signal, removing some of the undesired distortion. A spread-spectrum pilot signal is used in one or both loops, to provide a reference signal that can be monitored by an adjustment circuit, which measures the magnitude and/or phase of a spread-spectrum signal that is injected into the interference-carrying signal and, based on that measurement, adjusts the amplitude, phase, and/or delay of the cancellation signal that is added to the interference-carrying signal. This yields a reduced-interference signal in which undesired distortion is reduced.

22 Claims, 13 Drawing Sheets